(12) United States Patent
Kim et al.

(10) Patent No.: US 11,883,857 B2
(45) Date of Patent: Jan. 30, 2024

(54) CLEANING SOLUTION DETECTION DEVICE

(71) Applicant: KCTECH CO., LTD., Gyeonggi-do (KR)

(72) Inventors: Hyung Chul Kim, Gyeonggi-do (KR); You Sun Jung, Busan (KR)

(73) Assignee: KCTECH CO., LTD., Gyeonggi-Do (KR)

( * ) Notice: Subject to any disclaimer, the term of this patent is extended or adjusted under 35 U.S.C. 154(b) by 290 days.

(21) Appl. No.: 17/505,185

(22) Filed: Oct. 19, 2021

(65) Prior Publication Data
US 2022/0126328 A1 Apr. 28, 2022

(30) Foreign Application Priority Data
Oct. 26, 2020 (KR) .......................... 10-2020-0139576

(51) Int. Cl.
*B08B 3/02* (2006.01)
*B08B 5/04* (2006.01)

(52) U.S. Cl.
CPC .................. *B08B 3/02* (2013.01); *B08B 5/04* (2013.01); *B08B 2203/0282* (2013.01)

(58) Field of Classification Search
CPC ....................................................... B08B 3/02
See application file for complete search history.

(56) References Cited

U.S. PATENT DOCUMENTS

| 2007/0023071 A1 | 2/2007 | Aulbers |
| 2017/0345680 A1 | 11/2017 | Lee |
| 2017/0345688 A1 | 11/2017 | Lee |

FOREIGN PATENT DOCUMENTS

| TW | 550665 B | 9/2003 |
| TW | 201030889 A | 8/2010 |

*Primary Examiner* — Jason Y Ko
(74) *Attorney, Agent, or Firm* — KDW Firm PLLC

(57) ABSTRACT

A cleaning solution detection device includes a transfer part configured to unload and transfer a substrate having a surface to which a cleaning solution is applied when a cleaning process is completed, a detector configured to detect the cleaning solution that falls from the surface of the substrate in a process in which the substrate is unloaded and transferred by the transfer part, and a controller configured to determine whether a dangerous situation occurs due to a fall of the cleaning solution based on information detected by the detector.

16 Claims, 8 Drawing Sheets

CLEANING SOLUTION DETECTION DEVICE

CROSS-REFERENCE TO RELATED APPLICATION

This application claims the benefit of Korean Patent Application No. 10-2020-0139576 filed on Oct. 26, 2020, in the Korean Intellectual Property Office, the entire disclosure of which is incorporated herein by reference for all purposes.

BACKGROUND

1. Field of the Invention

One or more example embodiments relate to a cleaning solution detection device.

2. Description of the Related Art

In general, semiconductors are manufactured by repeatedly performing a series of processes such as lithography, deposition, and etching. Contaminants such as various particles, metal impurities, or organic materials remain on a surface of a substrate constituting a semiconductor by repeated processes. Due to such contaminants remaining on the substrate, the reliability of the semiconductor may decrease. To remove the contaminants, a process of cleaning and drying a substrate in a manufacturing process of a semiconductor is required.

The substrate is transferred from a cleaning device to a drying device through a drying process after a cleaning process. In other words, if a cleaning solution is applied to the substrate in a cleaning chamber, the substrate may be transferred to a supercritical drying device in a state in which the cleaning solution is applied. In a process of transferring the substrate, the cleaning solution applied to the surface of the substrate may be lost due to factors such as shaking of the substrate or an external environment. If the cleaning solution applied to the substrate is lost, the substrate may be dried, which may cause an occurrence of leaning or result in a process defect of the substrate. In addition, due to a loss of the cleaning solution, a process efficiency may decrease, and an economic loss may occur. Therefore, there is a desire for a detection device of detecting a loss of a cleaning solution applied to a substrate in a process of transferring the substrate from a cleaning device to a drying device, of warning of the loss of the cleaning solution, and of controlling a transfer device.

The above description is information the inventor(s) acquired during the course of conceiving the disclosed technology, or already possessed at the time, and is not necessarily art publicly known before the present application was filed.

SUMMARY

An aspect is to provide a cleaning solution detection device that may detect leakage of a cleaning solution on a substrate to which the cleaning solution is applied in a process of unloading and transferring the substrate, may send a warning signal and may control an operation of a transfer part.

An aspect is to provide a cleaning solution detection device that may collect a cleaning solution that leaks, and may effectively detect and measure the leaking cleaning solution.

According to an example embodiment, there is provided a cleaning solution detecting device including a transfer part configured to unload and transfer a substrate having a surface to which a cleaning solution is applied when a cleaning process is completed, a detector configured to detect the cleaning solution that falls from the surface of the substrate in a process of transferring the substrate by the transfer part, and a controller configured to determine whether a dangerous situation occurs due to a fall of the cleaning solution based on information detected by the detector.

The detector may include a collection member configured to collect the cleaning solution that falls from the substrate, and a flow path connected to the collection member and configured to provide a passage through which the collected cleaning solution flows.

The collection member may be formed to be inclined downward toward a center.

The collection member may include a through hole formed in the center, and the flow path may be connected to the through hole.

The collection member may be located below the transfer part to collect the cleaning solution that falls from the substrate.

The detector may further include a pressure sensor configured to measure an internal pressure of the flow path.

The controller may be configured to determine that the dangerous situation occurs when a measurement value measured by the pressure sensor exceeds a predetermined criterion.

The detector may further include a leakage sensor configured to detect a cleaning solution that leaks into the flow path.

The leakage sensor may be installed in the through hole.

The controller may be configured to determine that the dangerous situation occurs when whether the cleaning solution leaks is measured by the leakage sensor.

The detector may further include a load sensor configured to measure a weight of the cleaning solution that falls onto the collection member.

The controller may be configured to determine that the dangerous situation occurs when a measurement value measured by the load sensor exceeds a predetermined criterion.

The controller may be configured to stop an operation of the transfer part when the controller determines that the dangerous situation occurs.

The cleaning solution detection device may further include a warning part configured to generate a warning signal when the controller determines that the dangerous situation occurs.

The cleaning solution detection device may further include a suction part configured to generate a suction flow in one end portion of the flow path.

A steam separator may be installed in the suction part.

Additional aspects of example embodiments will be set forth in part in the description which follows and, in part, will be apparent from the description, or may be learned by practice of the disclosure.

According to example embodiments, a cleaning solution detecting device may detect leakage of a cleaning solution on a substrate to which the cleaning solution is applied in a process of unloading and transferring the substrate, may send a warning signal and may control an operation of a transfer part, thereby preventing an occurrence of a process defect and enhancing a process efficiency.

According to example embodiments, a cleaning solution detecting device may collect a cleaning solution that leaks and may effectively detect and measure the leaking cleaning solution based on a characteristic of the cleaning solution.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
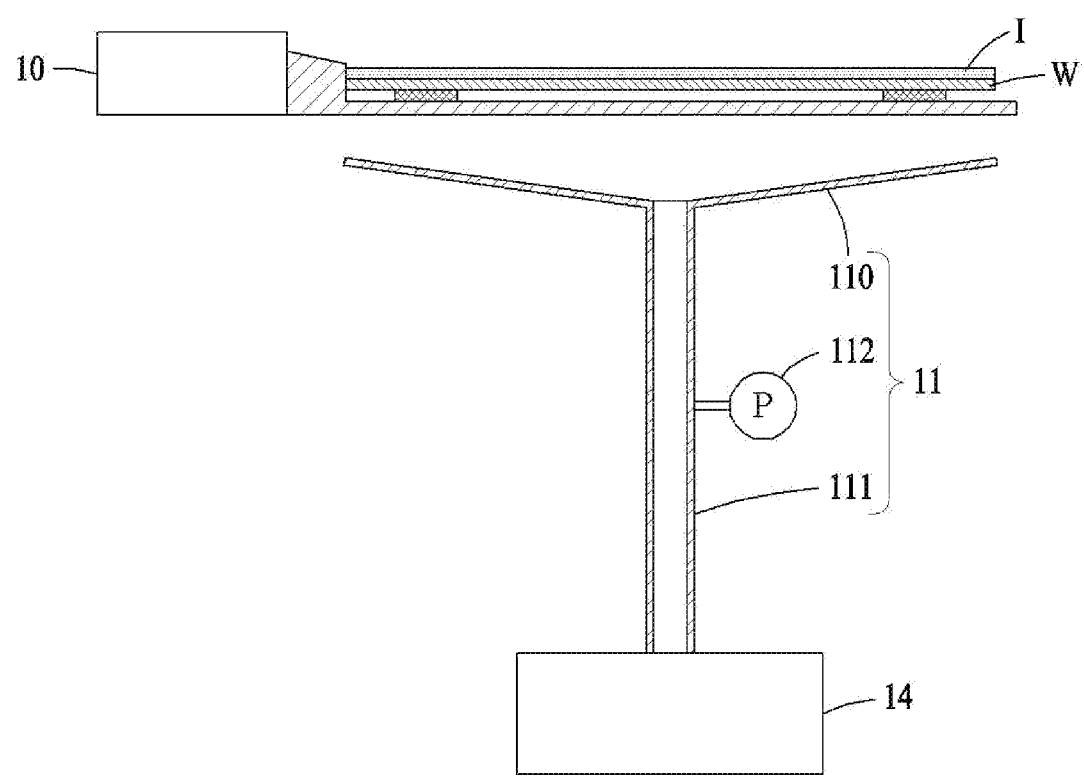
FIG. 1 is a diagram schematically illustrating a cleaning solution detection device according to an example embodiment.

Hereinafter, example embodiments will be described in detail with reference to the accompanying drawings. However, various alterations and modifications may be made to the example embodiments. Here, the example embodiments are not construed as limited to the disclosure. The example embodiments should be understood to include all changes, equivalents, and replacements within the idea and the technical scope of the disclosure.

The terminology used herein is for the purpose of describing particular example embodiments only and is not to be limiting of the example embodiments. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments with reference to the accompanying drawings, like reference numerals refer to like constituent elements and a repeated description related thereto will be omitted. In the description of example embodiments, detailed description of well-known related structures or functions will be omitted when it is deemed that such description will cause ambiguous interpretation of the present disclosure.

Also, in the description of the components, terms such as first, second, A, B, (a), (b) or the like may be used herein when describing components of the present disclosure. These terms are used only for the purpose of discriminating one constituent element from another constituent element, and the nature, the sequences, or the orders of the constituent elements are not limited by the terms. When one constituent element is described as being "connected", "coupled", or "attached" to another constituent element, it should be understood that one constituent element can be connected or attached directly to another constituent element, and an intervening constituent element can also be "connected", "coupled", or "attached" to the constituent elements.

The same name may be used to describe an element included in the example embodiments described above and an element having a common function. Unless otherwise mentioned, the descriptions on the example embodiments may be applicable to the following example embodiments and thus, duplicated descriptions will be omitted for conciseness.

Figure 2A:
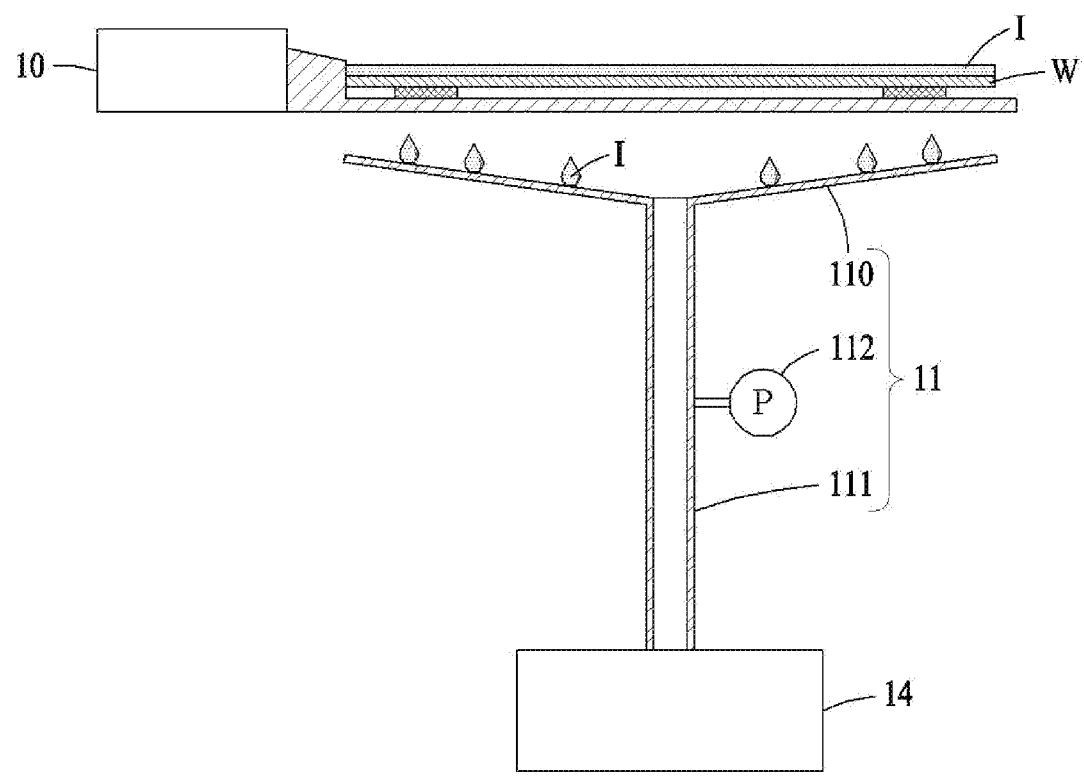
FIG. 2A is a diagram schematically illustrating a cleaning solution detection device in an example in which a cleaning solution is collected according to an example embodiment.
Figure 2B:
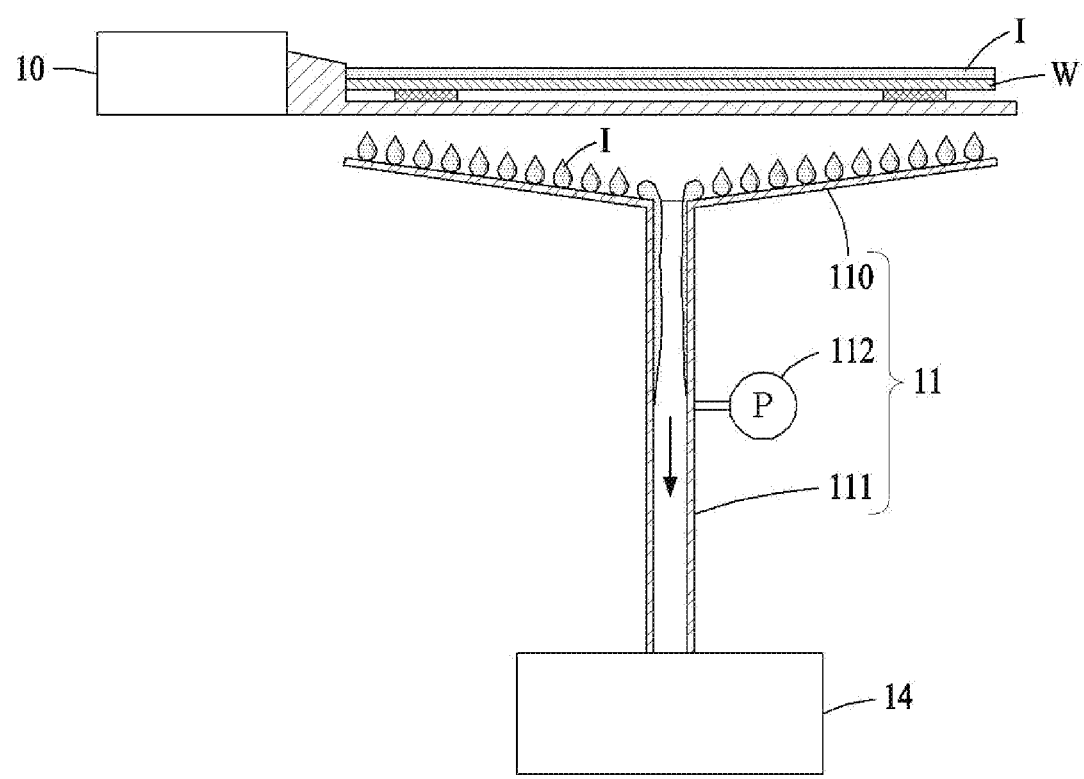
FIG. 2B is a diagram schematically illustrating a cleaning solution detection device in an example in which a cleaning solution flows according to an example embodiment.
Figure 3:
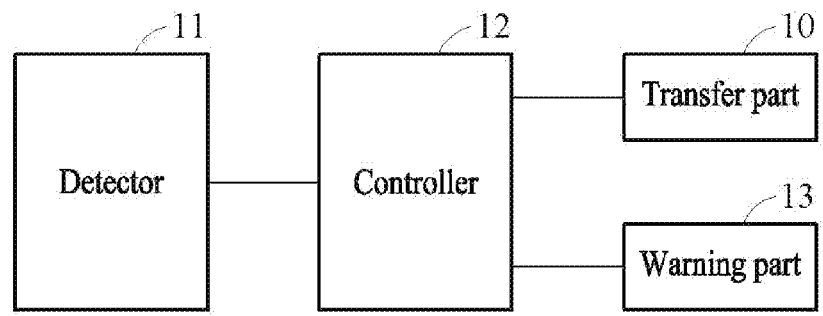
FIG. 3 is a block diagram illustrating a cleaning solution detection device according to an example embodiment.

FIG. 1 is a diagram schematically illustrating a cleaning solution detection device according to an example embodiment, FIG. 2A is a diagram schematically illustrating a cleaning solution detection device in an example in which a cleaning solution is collected according to an example embodiment, and FIG. 2B is a diagram schematically illustrating a cleaning solution detection device in an example in which a cleaning solution flows according to an example embodiment. FIG. 3 is a block diagram diagram illustrating a cleaning solution detection device according to an example embodiment.

Referring to FIGS. 1 to 3, a cleaning solution detection device 1 may detect a cleaning solution I that falls from a substrate W in a transfer process of transferring the substrate W, may send a warning signal to an administrator according to a degree of detection of the cleaning solution I, and may control the transfer process. For example, in a process in which the substrate W is transferred for a drying process when a cleaning process is completed, the cleaning solution detection device 1 may detect a state in which the cleaning solution I applied onto the substrate W falls. Specifically, the cleaning solution I that falls toward a lower side of the substrate W may be collected, and the cleaning solution I may be detected using a characteristic of the cleaning solution I. The cleaning solution detection device 1 may send a warning signal based on information about the detected cleaning solution I, and may control the transfer process to prevent the cleaning solution I from falling. Thus, the cleaning solution detection device 1 may prevent the cleaning solution I from falling, to increase a process efficiency and block an occurrence of a problem such as process defects in advance.

The cleaning solution detection apparatus 1 may include a transfer part 10, a detector 11, a controller 12, a warning part 13, and a suction part 14.

The transfer part 10 may transfer the substrate W. The transfer part 10 may unload the substrate W having a surface to which the cleaning solution I is applied when the cleaning process is completed, and may transfer the substrate W to a chamber for a drying process. The transfer part 10 may load or unload the substrate W in a process in which the drying process is performed on the substrate W after the cleaning process. Here, the cleaning solution I may be applied to the surface of the substrate W after the cleaning process is completed. The transfer part 10 may include a support member for supporting the substrate W. The supporting member may support the substrate W so that the substrate W may not be shaken and may not slide.

The detector 11 may detect the cleaning solution I that falls from the surface of the substrate W, in a process in which the substrate W is transferred by the transfer part 10. For example, the detector 11 may be located below the transfer part 10 to collect the cleaning solution I that falls while the substrate W is being transferred. When a large amount of cleaning solution I is collected and flows, the detector 11 may detect a degree to which the cleaning solution I leaks, based on the characteristic of the cleaning solution I.

The detector 11 may include a collection member 110, a flow path 111, and a pressure sensor 112.

The collection member 110 may collect the cleaning solution I that falls from the surface of the substrate W. For example, the collection member 110 may be located below the transfer part 10 to collect the cleaning solution I that falls from the substrate W. In addition, the collection member 110 may be formed to be inclined downward toward the center. A through hole may be formed at a lowest point of the collection member 110. The collection member 110 may have an area greater than that of the support member. Specifically, when viewed from the top, the support member may be located inside the collection member 110. Based on the above configuration, the collection member 110 may easily collect the cleaning solution I that falls from the substrate W.

The flow path 111 may be connected to the collection member 110 to provide a passage through which the collected cleaning solution I flows. Generally, considering a phenomenon in which the cleaning solution I falls, the collection member 110 may be connected to a lower side of the transfer part 10. Specifically, the flow path 111 may fluidly communicate with the through hole formed in the collection member 110. Accordingly, the collected cleaning solution I may flow toward the through hole along an inclination of the collection member 110 and may enter the flow path 111 that fluidly communicates with the through hole.

Figure 4:
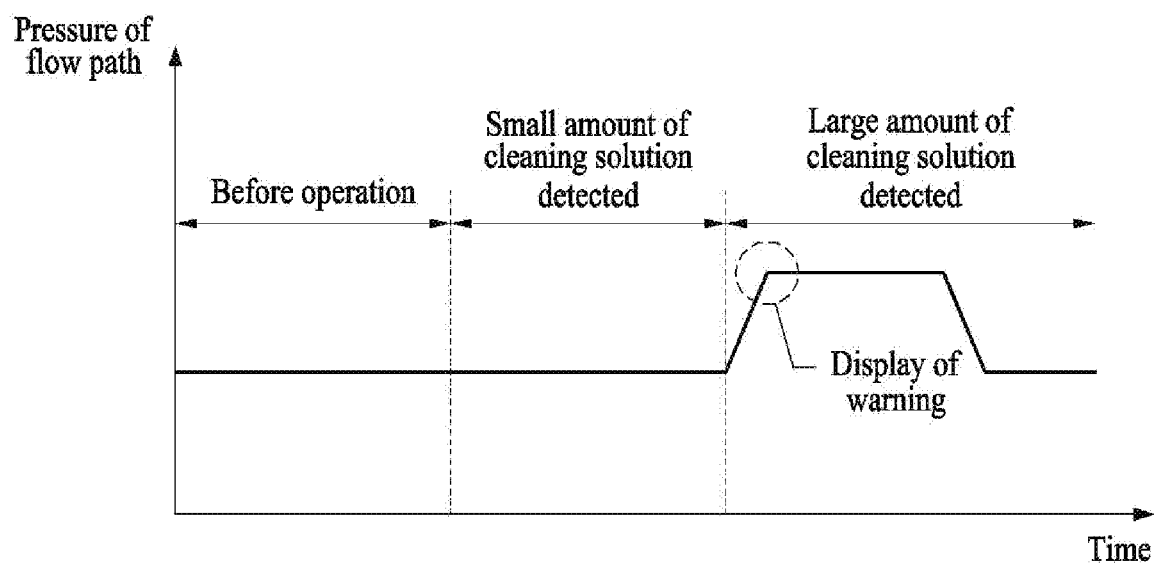
FIG. 4 is a graph of a pressure sensor according to an example embodiment.

The pressure sensor 112 may measure an internal pressure of the flow path 111. For example, the pressure sensor 112 may measure the internal pressure of the flow path 111 that is changed by the cleaning solution I that flows in the flow path 111, to provide information used to determine whether the cleaning solution I flows into the flow path 111. Specifically, referring to FIG. 4, a constant measurement value measured by the pressure sensor 112 may be maintained in a stage in which the cleaning solution I does not fall. For example, the transfer part 10 may be in a stationary state, or the transfer part 10 may transfer the substrate W normally. In a stage in which a small amount of the cleaning solution I starts to fall, the small amount of the cleaning solution I may be collected by the collection member 110. In this example, due to the small amount of the cleaning solution I, the cleaning solution I may be formed on the collection member 110 or may evaporate, and accordingly the cleaning solution I may not flow to the flow path 111. Thus, the measurement value measured by the pressure sensor 112 may remain unchanged. In a stage in which a large amount of the cleaning solution I falls, the large amount of the cleaning solution I may be collected by the collection member 110 and may flow into the flow path 111 in the form of a fluid. Thus, the measurement value measured by the pressure sensor 112 may change. For example, the measured pressure may rapidly increase. When the measurement value measured by the pressure sensor 112 exceeds a predetermined criterion due to an increase in a pressure in the flow path 111, the controller 12 that will be described below may determine that a dangerous situation occurs. In this example, the predetermined criterion may be a criterion based on a flow amount and/or a flow duration of the falling cleaning solution I received from the administrator.

The controller 12 may determine whether a dangerous situation occurs due to a fall of the cleaning solution I, based on information detected by the detector 11. In addition, when the dangerous situation is determined to occur, the controller 12 may control an operation of the transfer part 10 and the detector 11. For example, when the controller 12 determines that the dangerous situation occurs, the controller 12 may stop the operation of the transfer part 10. In this example, the dangerous situation may refer to a state in which there is a possibility that a process is not performed normally because an excessively large amount of cleaning solution I applied onto the substrate W falls in a process of transferring the substrate W. Specifically, the dangerous situation may refer to a state in which a process defect is likely to occur or a process efficiency is likely to decrease due to an occurrence of a leaning phenomenon. According to the above control, it may be possible to prevent an occurrence of a process defect and a decrease in a process efficiency due to a fall of the cleaning solution I.

When the controller 12 determines that the dangerous situation occurs, the warning part 13 may generate a warning signal. The warning part 13 may visually display a danger level and an amount of the cleaning solution I to be detected, and may generate warning sound differentiated according to the danger level. The warning part 13 may include a display configured to visually display information associated with a dangerous situation, and a speaker configured to generate warning sound. The warning part 13 may transfer information about a dangerous situation by providing visual and audible information to the administrator.

The suction part 14 may generate a suction flow in one end portion of the flow path 111. For example, the suction part 14 may include a steam separator connected to one end of the flow path 111. The steam separator may separate the cleaning solution I in a fluid state that flows along the flow path 111 from the air.

Figure 5:
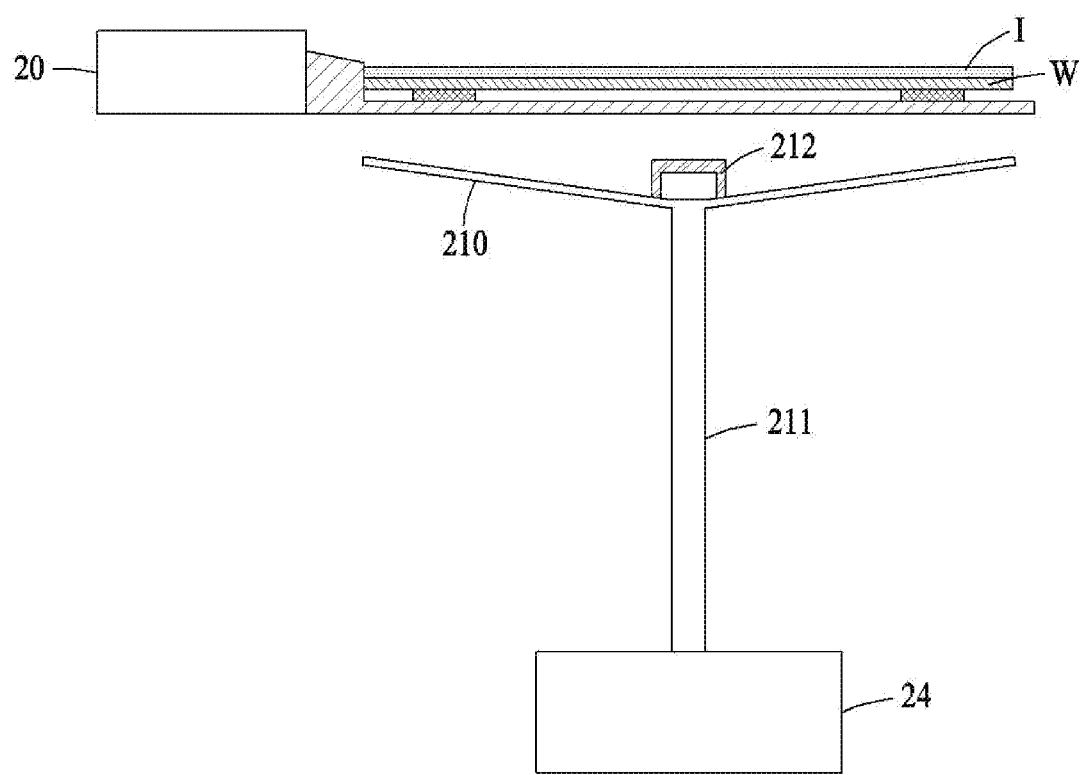
FIG. 5 is a diagram schematically illustrating a cleaning solution detection device according to an example embodiment.
Figure 6:
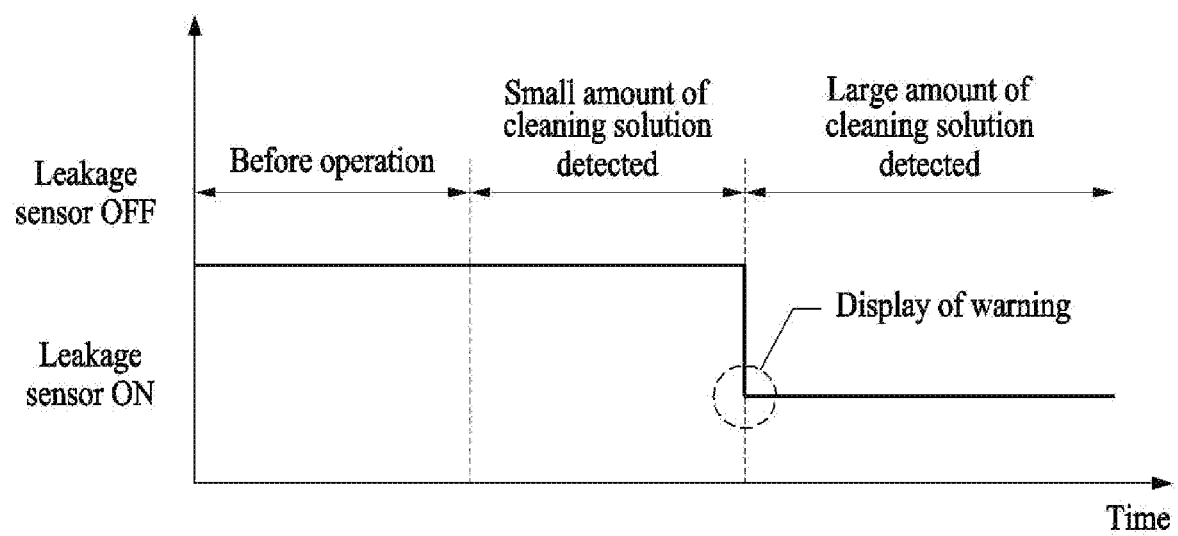
FIG. 6 is a graph of a leakage sensor according to an example embodiment.

FIG. 5 is a diagram schematically illustrating a cleaning solution detection device according to an example embodiment, and FIG. 6 is a graph of a leakage sensor according to an example embodiment.

A cleaning solution detection device 2 may include a transfer part 20, a detector 21, a controller 22, a warning part 23, and a suction part 24. The detector 21 may include a collection member 210, a flow path 211, and a leakage sensor 212. Further description of a configuration overlapping those of the aforementioned example embodiment will be omitted.

Referring to FIGS. 5 and 6, the leakage sensor 212 may detect a cleaning solution I that leaks into the flow path 211. For example, the leakage sensor 212 may be installed in a through hole to detect whether the cleaning solution I flows in the form of a fluid. Referring to FIG. 5, in a stage in which the cleaning solution I does not fall, the leakage sensor 212 may be in an off state. In a stage in which a small amount of cleaning solution I starts to fall, the small amount of the cleaning solution I may be collected by the collection member 210, and accordingly the cleaning solution I may not flow into the flow path 211 and the leakage sensor 212 may also be in the off state. In a stage in which a large amount of cleaning solution I falls, the large amount of the cleaning solution I may be collected by the collection member 210 and may flow into the flow path 211 in the form of a fluid, and accordingly the leakage sensor 212 may be in an on state to detect leakage of the cleaning solution I. When whether the cleaning solution I leaks is measured by the leakage sensor 212, the controller 22 may determine that a dangerous situation occurs.

Figure 7:
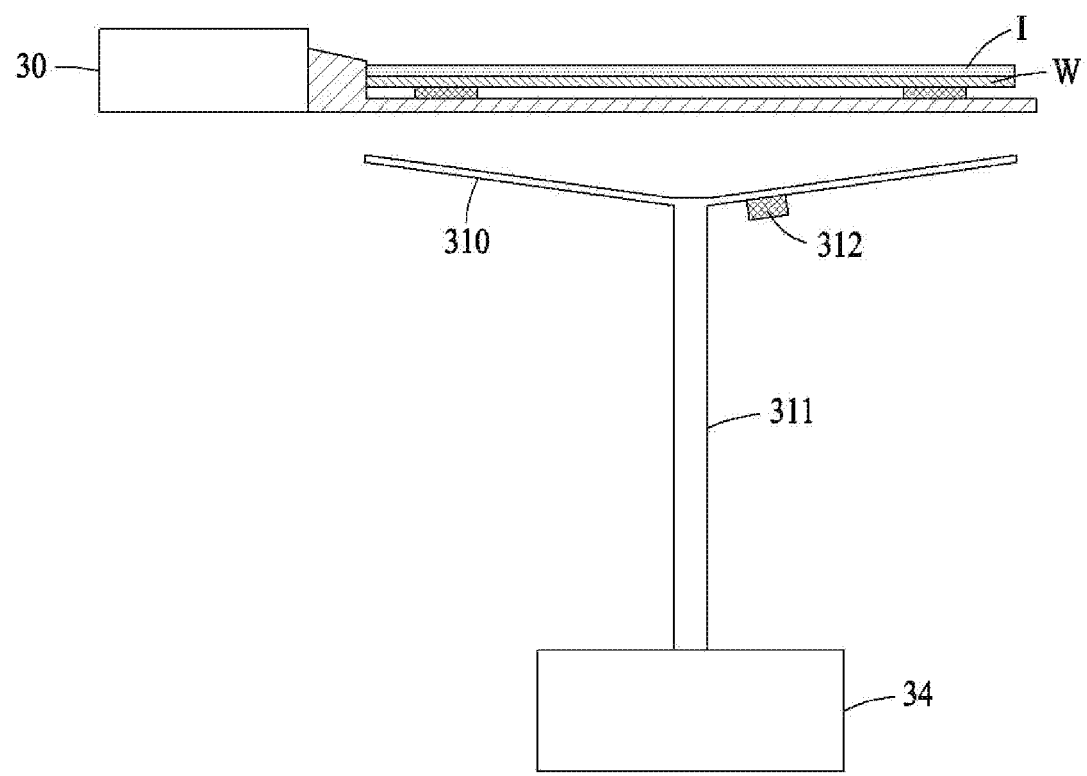
FIG. 7 is a diagram schematically illustrating a cleaning solution detection device according to an example embodiment.
Figure 8:
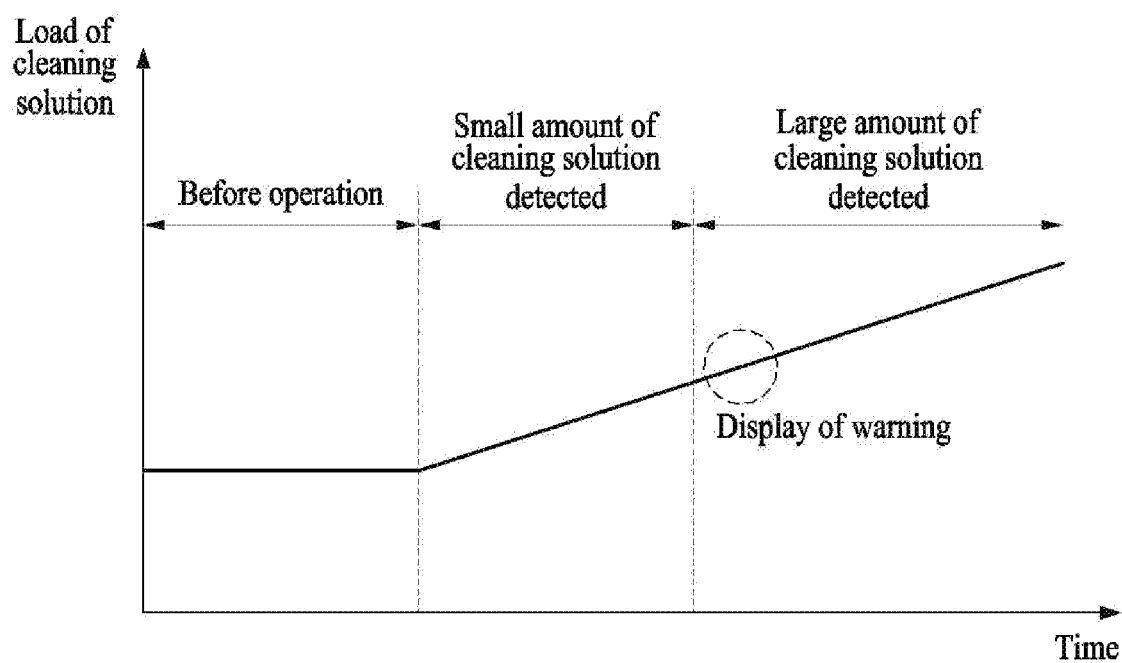
FIG. 8 is a graph of a load sensor according to an example embodiment.

FIG. 7 is a diagram schematically illustrating a cleaning solution detection device according to an example embodiment, and FIG. 8 is a graph of a load sensor according to an example embodiment.

A cleaning solution detection device 3 may include a transfer part 30, a detector 31, a controller 32, a warning part 33, and a suction part 34. The detector 31 may include a collection member 310, a flow path 311, and a load sensor 312. Further description of a configuration overlapping that of the aforementioned example embodiment will be omitted.

Referring to FIGS. 7 and 8, the load sensor 312 may measure a weight of a cleaning solution that falls onto the collection member 310. For example, the load sensor 312 may be installed under the collection member 310. Referring to FIG. 7, in a stage in which the cleaning solution I does not fall, a constant measurement value measured by the load sensor 312 may be maintained. Since a small amount of the cleaning solution I is collected by the collection member 310 in a stage in which the small amount of the cleaning solution I starts to fall, a load measured by the load sensor 312 may increase in proportion to an amount of the cleaning solution I. Since a large amount of the cleaning solution I is collected by the collection member 310 in a stage in which the large amount of the cleaning solution I falls, the load measured by the load sensor 312 may continue to increase in proportion to the amount of the cleaning solution I. When the measurement value measured by the load sensor 312 exceeds a predetermined criterion, the controller 33 may determine that a dangerous situation occurs.

While this disclosure includes specific example embodiments, it will be apparent to one of ordinary skill in the art that various changes in form and details may be made in these example embodiments without departing from the spirit and scope of the claims and their equivalents. The example embodiments described herein are to be considered in a descriptive sense only, and not for purposes of limitation. Descriptions of features or aspects in each example embodiment are to be considered as being applicable to similar features or aspects in other example embodiments. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A cleaning solution detection device comprising:
    a transfer part configured to unload and transfer a substrate having a surface to which a cleaning solution is applied when a cleaning process is completed;
    a detector configured to detect the cleaning solution that falls from the surface of the substrate in a process of transferring the substrate by the transfer part; and
    a controller configured to determine whether a dangerous situation occurs due to a fall of the cleaning solution based on information detected by the detector.

2. The cleaning solution detection device of claim 1, wherein the detector comprises:
    a collection member configured to collect the cleaning solution that falls from the substrate; and
    a flow path connected to the collection member and configured to provide a passage through which the collected cleaning solution flows.

3. The cleaning solution detection device of claim 2, wherein the collection member is formed to be inclined downward toward a center.

4. The cleaning solution detection device of claim 3, wherein the collection member comprises a through hole formed in the center, and the flow path is connected to the through hole.

5. The cleaning solution detection device of claim 4, wherein the collection member is located below the transfer part to collect the cleaning solution that falls from the substrate.

6. The cleaning solution detection device of claim 2, wherein the detector further comprises a pressure sensor configured to measure an internal pressure of the flow path.

7. The cleaning solution detection device of claim 6, wherein the controller is configured to determine that the dangerous situation occurs when a measurement value measured by the pressure sensor exceeds a predetermined criterion.

8. The cleaning solution detection device of claim 2, wherein the detector further comprises a leakage sensor configured to detect a cleaning solution that leaks into the flow path.

9. The cleaning solution detection device of claim 8, wherein the leakage sensor is installed in the through hole.

10. The cleaning solution detection device of claim 9, wherein the controller is configured to determine that the dangerous situation occurs when whether the cleaning solution leaks is measured by the leakage sensor.

11. The cleaning solution detection device of claim 2, wherein the detector further includes a load sensor configured to measure a weight of the cleaning solution that falls onto the collection member.

12. The cleaning solution detection device of claim 11, wherein the controller is configured to determine that the dangerous situation occurs when a measurement value measured by the load sensor exceeds a predetermined criterion.

13. The cleaning solution detection device of claim 1, wherein the controller is configured to stop an operation of the transfer part when the controller determines that the dangerous situation occurs.

14. The cleaning solution detection device of claim 1, further comprising:
    a warning part configured to generate a warning signal when the controller determines that the dangerous situation occurs.

15. The cleaning solution detection device of claim 1, further comprising:
    a suction part configured to generate a suction flow in one end portion of the flow path.

16. The cleaning solution detection device of claim 15, wherein a steam separator is installed in the suction part.

* * * * *